(12) United States Patent
Theuss et al.

(10) Patent No.: US 8,253,210 B2
(45) Date of Patent: Aug. 28, 2012

(54) SEMICONDUCTOR DEVICE INCLUDING A MAGNETIC SENSOR CHIP

(75) Inventors: Horst Theuss, Wenzenbach (DE); Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 390 days.

(21) Appl. No.: 12/433,531

(22) Filed: Apr. 30, 2009

(65) Prior Publication Data

US 2010/0276769 A1    Nov. 4, 2010

(51) Int. Cl.
*H01L 29/82* (2006.01)
*G11C 11/02* (2006.01)

(52) U.S. Cl. ......... 257/421; 438/3; 257/427; 360/324.2; 365/157; 365/158

(58) Field of Classification Search .................. 257/414, 257/421–427, E29.323; 438/3; 360/324–326; 365/157–158
See application file for complete search history.

(56) References Cited

U.S. PATENT DOCUMENTS

| 4,188,605 | A | 2/1980 | Stout |
| 6,274,939 | B1 | 8/2001 | Wolf |
| 7,250,760 | B2 | 7/2007 | Ao |
| 2004/0150091 | A1* | 8/2004 | Stobbs ........................ 257/687 |
| 2005/0116255 | A1* | 6/2005 | Kato et al. .................... 257/200 |
| 2006/0038245 | A1 | 2/2006 | Terui |
| 2007/0018642 | A1* | 1/2007 | Ao ................................ 324/252 |
| 2008/0135959 | A1 | 6/2008 | Theuss et al. |
| 2009/0057885 | A1 | 3/2009 | Theuss |

FOREIGN PATENT DOCUMENTS

DE        102006057970        6/2008

* cited by examiner

*Primary Examiner* — Jami M Valentine

(74) *Attorney, Agent, or Firm* — Dicke, Billig & Czaja, PLLC

(57) ABSTRACT

A semiconductor device includes a magnetic sensor chip, an electrically conducting layer wafer-level patterned in contact with the magnetic sensor chip, encapsulation material disposed on the magnetic sensor chip, and an array of external contact elements electrically coupled with the magnetic sensor chip through the electrically conducting layer.

22 Claims, 10 Drawing Sheets

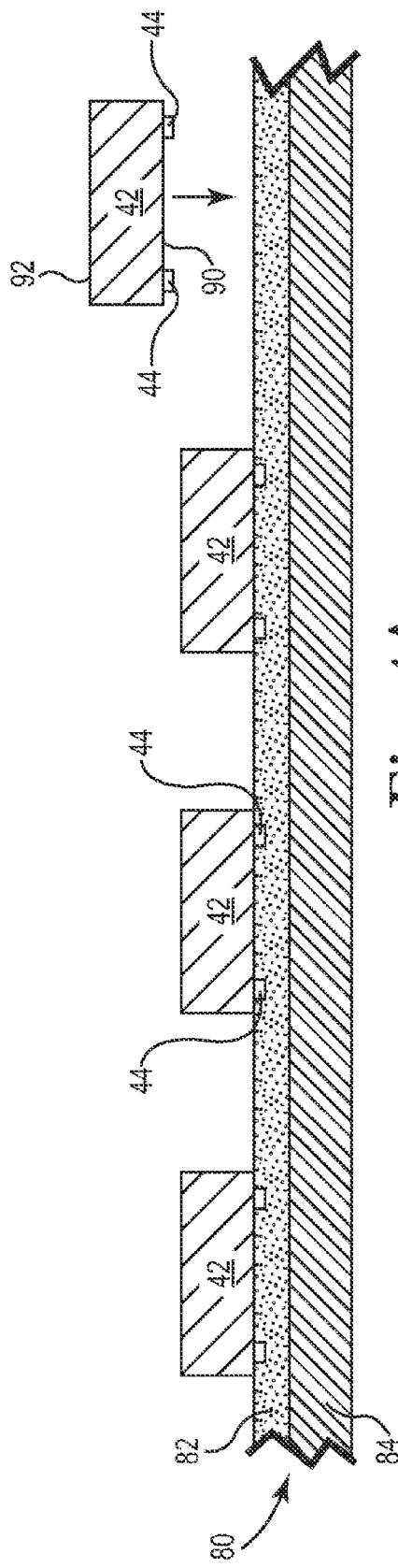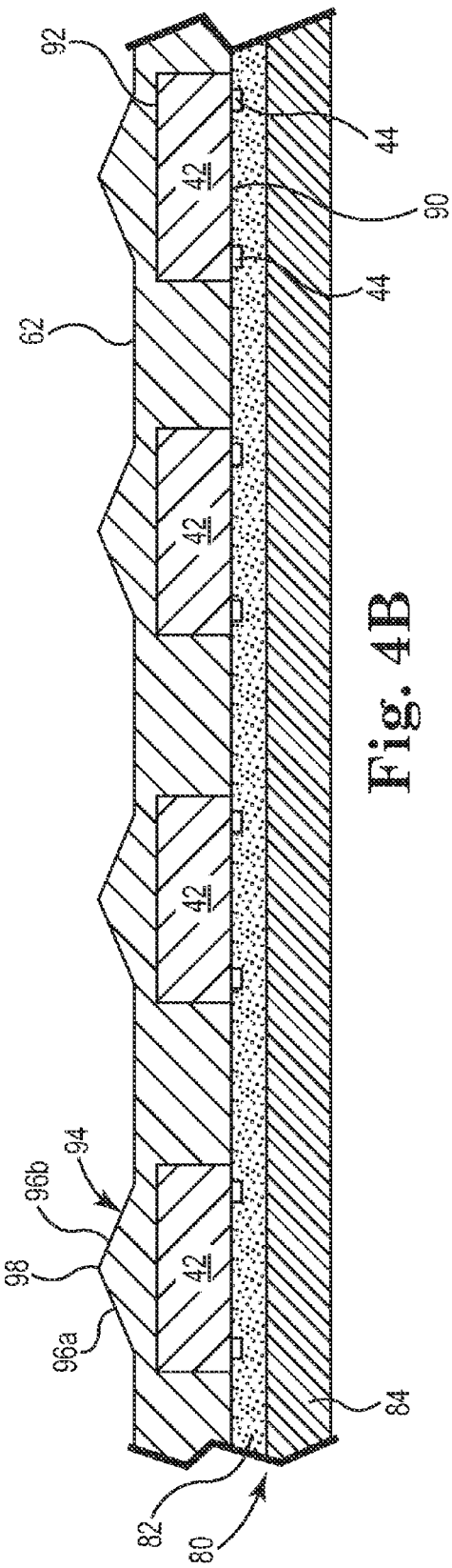

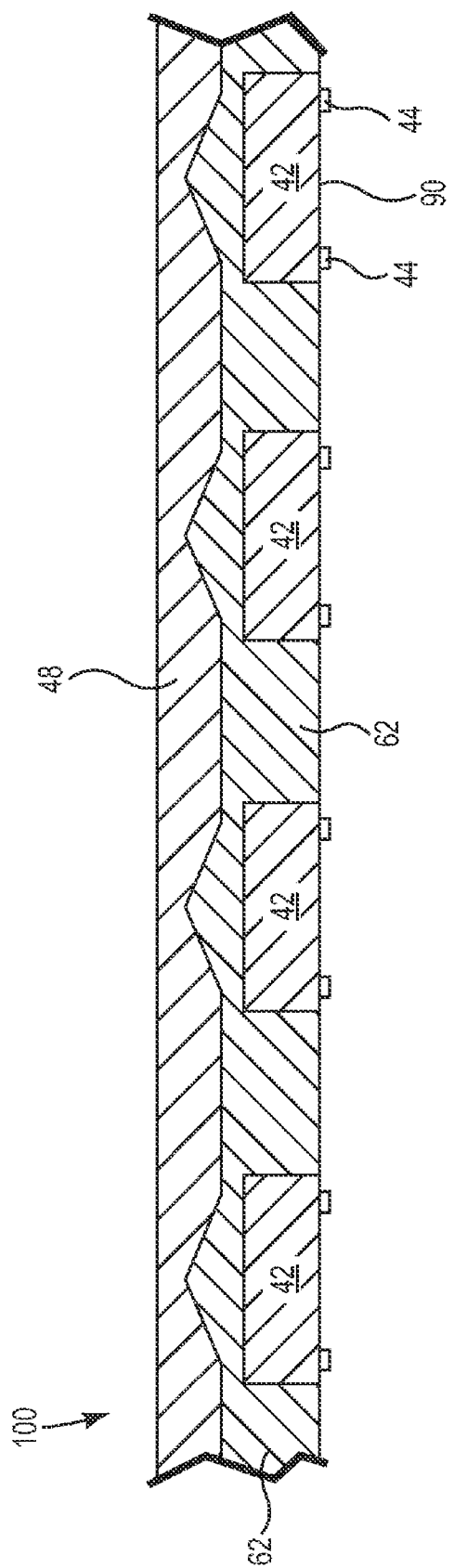

SEMICONDUCTOR DEVICE INCLUDING A MAGNETIC SENSOR CHIP

BACKGROUND

Magnetic field sensors include a semiconductor chip and a magnet oriented to direct magnetic filed lines through a sensing portion of the chip. Magnetic field sensors are usefully employed as position sensors or rate-of-rotation sensors.

One example of a magnetic field sensor includes a chip sensor attached to a leadframe. The chip sensor is provided to a customer who positions the chip sensor between a permanent magnet and a movable component, such as a gear wheel. It is possible that the customer may bend the leadframe in order to position the chip sensor in a preferred orientation. Apart from the preferred orientation, during use it may nevertheless be difficult to realize perpendicular magnetic field penetration through the chip sensor. Both of the above noted aspects related to the use of conventional magnetic field sensors are undesirable.

Another example of a magnetic field sensor includes a chip sensor package that is positioned relative to a multi-pole magnetic gear wheel. In this case, the gear wheel provides the magnetic field. Such multi-pole magnetic gear wheels are complex and expensive, and the chip sensor package is still subject to the undesirable limitations noted above.

For these and other reasons, there is a need for the present invention.

SUMMARY

One aspect provides a semiconductor device including a magnetic sensor chip, an electrically conducting layer wafer-level patterned in contact with the magnetic sensor chip, encapsulation material disposed on the magnetic sensor chip, and an array of external contact elements electrically coupled with the magnetic sensor chip through the electrically conducting layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 4A-4G are schematic cross-sectional views of the fabrication of semiconductor devices to include a bias magnet fabricated into the device on the wafer level according to various embodiments.

DETAILED DESCRIPTION

Figure 1:
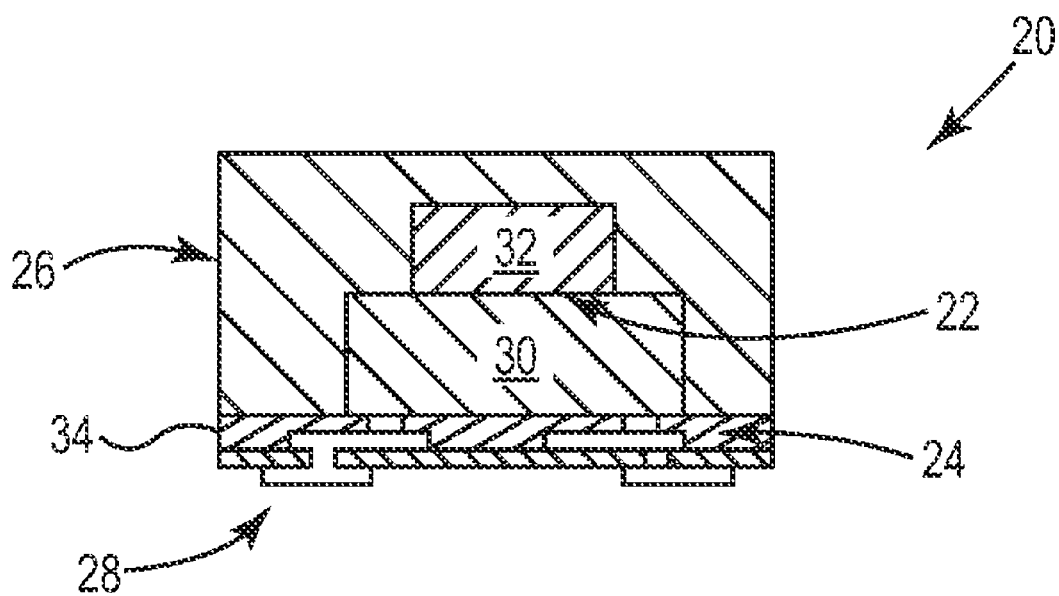
FIG. 1 is a schematic cross-sectional view of a semiconductor device including a permanent magnet attached to a magnetic sensor chip according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may be used to indicate that two elements cooperate or interact with each other regardless of whether they are in direct physical or electrical contact. Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the redistribution layer (RDL). The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

The semiconductor chips may be covered with an encapsulant material. The encapsulant material can be any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, fan-out embedded dies can be fabricated. The fan-out embedded dies can be arranged in an array having the form e.g., of a wafer and will thus be called a "re-configured wafer" further below. However, it should be appreciated that the fan-out embedded die array is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments provide a semiconductor device with a bias magnetic fabricated into the device on the wafer level. One example of such a semiconductor device is a sensor package that is singulated or separated from a wafer providing multiple similar sensor packages. All of the packages have a conducting layer that is patterned across the wafer, where the conducting layer contacts a magnetic sensor chip of each package. In this manner, packages according to embodiments described herein do not have leadframes and the footprint of the sensor package is similar to a footprint of the magnetic sensor chip.

Embodiments provide a semiconductor device sensor package including a magnetic sensor chip, an electrically conducting layer wafer-level patterned in contact with the magnetic sensor chip, encapsulation material disposed on the magnetic sensor chip, and an array of external contact elements electrically coupled with the magnetic sensor chip through the electrically conducting layer.

In this specification, wafer-level patterned means depositing or affixing or attaching one or more layers to two or more chips, for example, the attachment of conducting lines on the wafer that contact elements of the chips. The attachment is accomplished by selectively patterning electrically conducting material onto the contact elements of the chips and separating the conducting material with areas of dielectric.

FIG. 1 is a schematic cross-sectional view of a semiconductor device 20 according to one embodiment. Semiconductor device 20 includes a magnetic sensor chip 22, an electrically conducting layer 24 wafer-level patterned in contact with magnetic sensor chip 22, encapsulation material 26 disposed on chip 22, and an array 28 of external contact elements electrically coupled with chip 22 through electrically conducting layer 24.

In one embodiment, magnetic sensor chip 22 includes a semiconductor chip 30 provided with magnetic sensors and a permanent magnet 32 attached to semiconductor chip 30. In on embodiment, electrically conducting layer 24 is patterned into a dielectric 34 and array 28 is patterned to communicate with layer 24. In one embodiment, encapsulation material 26 is a non-magnetic encapsulation material formed of epoxy, resin, or polymer and is formed over semiconductor chip 30 and magnet 32 to configure device 20 as a semiconductor package.

Figure 2:
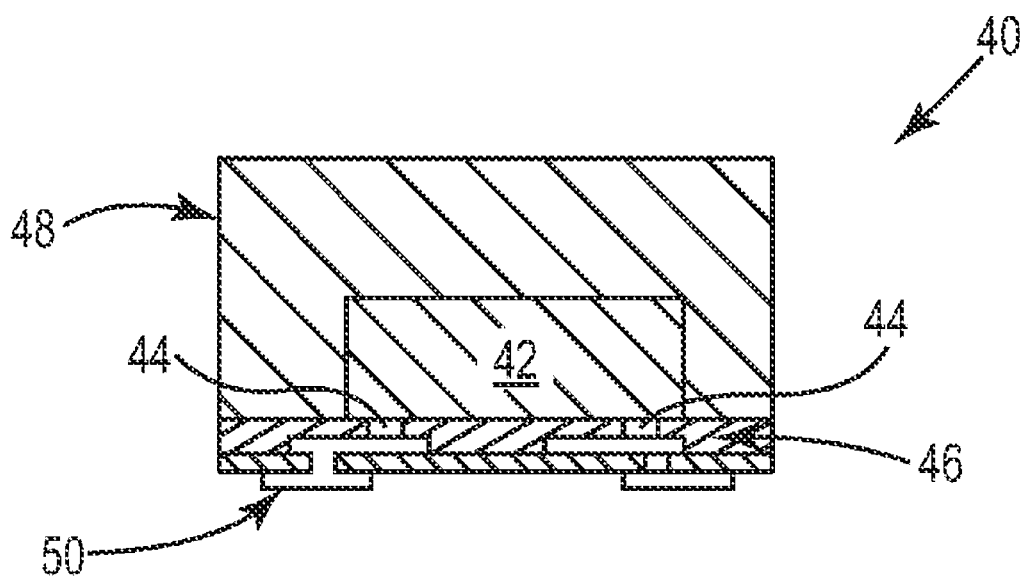
FIG. 2 is a schematic cross-sectional view of a semiconductor device including a magnetic sensor chip encapsulated by magnetic encapsulation material according to one embodiment.

FIG. 2 is a schematic cross-sectional view of a semiconductor device 40 according to one embodiment. Semiconductor device 40 includes a magnetic sensor chip 42 having contact elements 44 provided on a first main face of chip 42, an electrically conducting layer 46 wafer-level patterned in contact with contact elements 44, magnetic encapsulation material 48 disposed on chip 42, and an array 50 of external contact elements coupled to electrically conducting layer 46 and electrically communicating with contact elements 44.

In one embodiment, chip 42 is provided with a magnetic resistive element configured to sense magnetic field lines, and magnetic encapsulation material 48 is provided as a permanent magnet communicating with sensor chip 42.

In one embodiment, magnetic encapsulation material 48 is provided as a polymer bonded permanent magnetic material that is magnetized during or after deposition over chip 42. In one embodiment, magnetic encapsulation material 48 includes a distribution of soft magnetic particles having low coercivity formed of Fe, FeSi, FeNi, FeCo, Ni or similar soft magnetic materials. In one embodiment, magnetic encapsulation material 48 includes a distribution of hard magnetic particles having high coercivity dispersed in a polymer matrix. The hard magnetic particles may be magnetized before or after curing of the polymer matrix material. Suitable hard magnetic particles include NdFeB, SmCo, AlNiCo, ferrites or similar magnetic particles. The particles (whether soft or hard magnetic particles) are distributed in polymer 46 and have a mean particle diameter of between approximately 20-150 micrometers.

In this specification, the coercivity of a ferromagnetic material is defined to be the intensity of an applied magnetic field employed to reduce the magnetization of that material to zero after the magnetization of the sample has been driven to saturation. Coercivity is usually measured in Oersteds (or ampere/meter) and is denoted $H_C$.

Hard magnetic materials have a coercivity of greater than 2,000 Oersteds. For example, NdFeB has a coercivity between approximately 10,000-12,000 Oersteds.

Soft magnetic materials have a coercivity of less than 1,000 Oersteds. For example, cobalt has a coercivity of approximately 2 Oersteds.

The magnetic sensor chip and a permanent magnet are integrated into the semiconductor package and configured to measure a magnetic field or changes in a magnetic field. The magnetic sensor chip in one embodiment measures a quantity defining the magnetic field, such as magnetic field strength or changes in magnetic field strength. In one embodiment, the magnetic sensor chip is configured to sense if the magnetic field exceeds a predetermined threshold value. In one example, the magnetic sensor chip is configured as a Hall sensor or a giant magneto-resistive sensor configured to measure magnetic field strength. To this end, in one embodiment the magnetic sensor chip includes circuits that drive a magnetic sensor and/or evaluate the measurement of signals recorded by the magnetic sensor. In another embodiment, the control and evaluation circuits are integrated into another semiconductor chip that interacts with the magnetic sensor chip.

Giant magneto-resistance (GMR) is a quantum mechanical effect observed in thin film structures having ferromagnetic and non-magnetic layers. GMR is characterized by a significant decrease in electrical resistance when the GMR device is in the presence of a magnetic field. In the absence of an external magnetic field, the direction of magnetization in the ferromagnetic layers of the GMR device is anti-parallel due to weak anti-ferromagnetic coupling between the layers. The result is relatively high resistance in the magnetic scattering. When an external magnetic field is applied to a GMR device, the magnetization of the adjacent ferromagnetic layers is parallel. The result is lower magnetic scattering and lower electrical resistance. The ferromagnetic layers are formed of ferromagnetic material characterized by coercivity.

In one embodiment, magnetic encapsulation material 48 is electrically conducting and it is desirable to electrically isolate surfaces of chip 42 and contact elements 44 from magnetic encapsulation material 48. In one embodiment, chip 42 is electrically isolated from magnetic encapsulation material 48 by coating chip 42 with a suitable resin, such as an epoxy or imide resin. In one embodiment, chip 42 is electrically isolated from magnetic encapsulation material 48 by coating chip 42 with a vapor phase polymerization of a suitable polymer, such as Parylene or by plasma deposition of silicon compounds, such as SiOx over surfaces of chip 42.

Figure 3A:
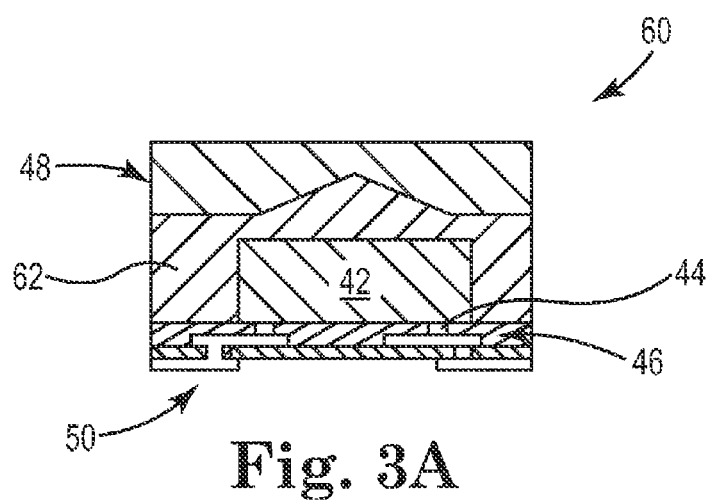
FIGS. 3A-3C are schematic cross-sectional views of a semiconductor device provided with a non-magnetic layer configured to shape magnetic field lines passing through a magnetic sensor chip according to one embodiment.
Figure 3B:
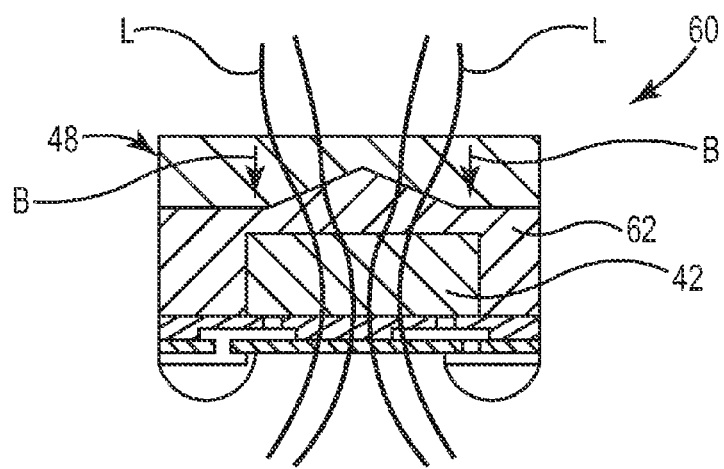

FIG. 3A and FIG. 3B are schematic cross-sectional views of a semiconductor device 60 according to one embodiment. Semiconductor device 60 includes a non-magnetic layer 62 disposed between chip 42 and magnetic encapsulation material 48. Non-magnetic layer 62 is configured to shape magnetic field lines L generated by magnetic field B passing through chip 42. In one embodiment, non-magnetic layer 62 includes a pyramid-shape configured to direct the magnetic field lines L perpendicularly through an active surface of chip 42. In one embodiment, non-magnetic layer 62 is molded over chip 42 from a suitable transfer molding resin and is selectively structured to direct the magnetic flux lines L in an approximately perpendicular manner through chip 42.

Figure 3C:
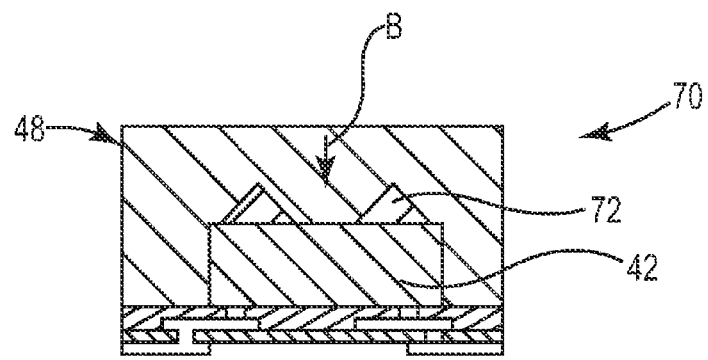

FIG. 3C is a schematic cross-sectional view of another embodiment of semiconductor device 70 including a non-magnetic layer 72 disposed between chip 42 and magnetic encapsulation material 48. In one embodiment, magnetic sensor chip 42 is provided with multiple magnetic sensors integrated across a face of chip 41. Non-magnetic layer 72 is spun from resin over the multiple magnetic sensors of chip 42 to provide local shaping of magnetic flux lines through multiple sensor areas on chip 42. In one embodiment, non-magnetic layer 72 is provided as a series of adjacent cones formed across a sensor surface of chip 42. A longitudinal cross-section taken through the cones results in the triangle shapes illustrated in FIG. 3C.

Semiconductor devices 20 (FIG. 1), 40 (FIG. 2), 60 (FIGS. 3A-3B), and 70 (FIG. 3C) are advantageously fabricated on the wafer level as one of several similar such semiconductor devices that are singulated from the wafer to provide a completed semiconductor package device, as described below.

FIGS. 4A-4G are schematic cross-sectional views of various embodiments of the fabrication of semiconductor devices that include a bias magnet integrated into the package on the wafer level.

FIG. 4A is a schematic cross-sectional view of magnetic sensor chips 42 placed on a carrier 80 that includes an adhesive 82 and a support 84. In one embodiment, adhesive 82 is provided as an adhesive foil that is deposited on a rigid metal support 84. Chips 42 are removably attached to carrier 80 for additional processing, and adhesive 82 and support 84 are configured for subsequent removal away from chips 42 after processing.

In one embodiment, each chip 42 includes contact elements 44 disposed on a first main face 90 opposite a second main face 92. Chip 42 is suitably configured as a Hall sensor, a magneto-resistive element, or a giant magnetic resistor. In one embodiment, second main face 92 is fabricated to include a magneto-resistive element for chip 42. Chips 42 disposed on carrier 80 are suited for subsequent processing to include other layers deposited at the wafer-level.

FIG. 4B is a schematic cross-sectional view of a non-magnetic layer 62 optionally molded over chips 42 according to one embodiment. In one embodiment, chips 42 are configured as magnetic sensor chips and non-magnetic layer 62 is transfer molded in a desired structure to shape or alter a pathway of magnetic field lines passing through chip 42. For example, in one embodiment non-magnetic layer 62 is molded over second main face 92 and around chip 42 and includes a major surface 94 that is structured to shape magnetic field lines passing through chip 42. In one embodiment, major surface 94 is structured to include a pyramid-shape formed by faces 96a, b sloping away from a pinnacle 98. The two-dimensional cross-sectional view of FIG. 4B illustrates two sloping faces 96a, b but it is to be understood that non-magnetic layer 62 is suitably molded to include three-dimensional structures where structured surface 94 includes four faces sloping away from pinnacle 98.

Figure 4C:
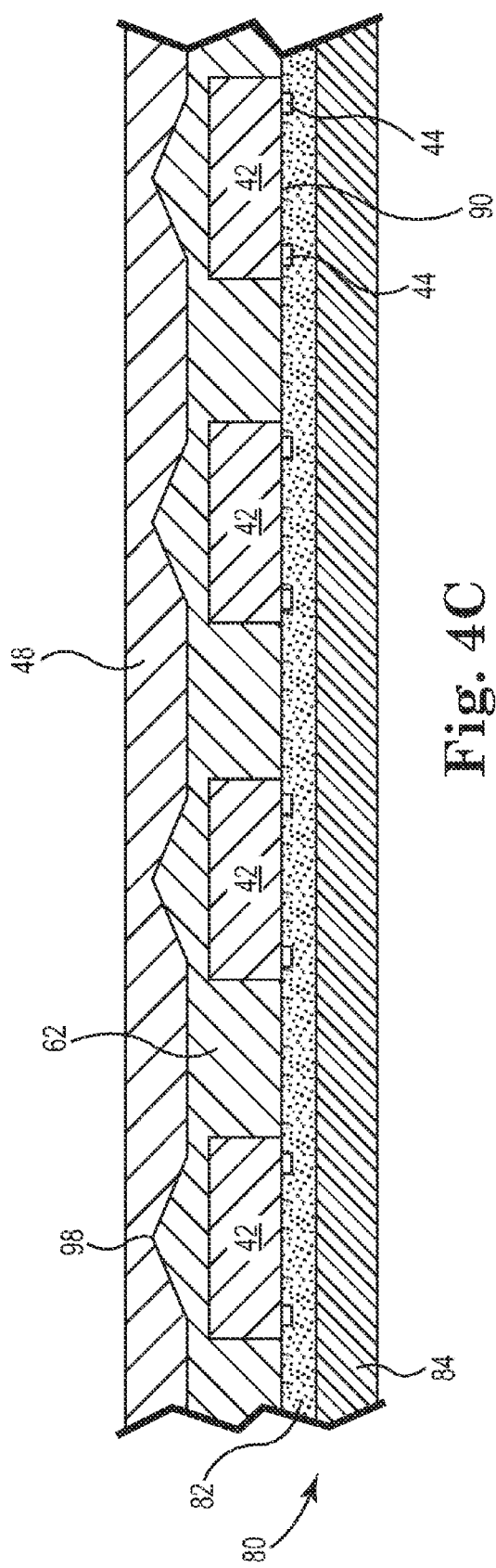

FIG. 4C is a schematic cross-sectional view of magnetic encapsulation material 48 molded over non-magnetic layer 62, chips 42, and carrier 80 according to one embodiment. Magnetic encapsulation material 48 desirably includes a distribution of permanent magnetic particles as described above distributed in a bonded polymer matrix and configured for molding over chips 42 and non-magnetic layer 62. In one embodiment, magnetic encapsulation material 48 is magnetized during molding. In one embodiment, magnetic encapsulation material 48 is magnetized after molding.

FIG. 4D is a schematic cross-sectional view of an encapsulated work piece 100 removed from carrier 80 (FIG. 4C) according to one embodiment. Carrier 80 has been removed to expose first main face 90 and contact elements 44 for subsequent wafer-level processing. Encapsulated work piece 100 includes multiple chips 42 and magnetic encapsulation material 48 integrally formed over chips 42. In one embodiment, magnetic encapsulation material 48 provides a bias magnet for each of the multiple chips 42 separated from work piece 100.

Figure 4E:
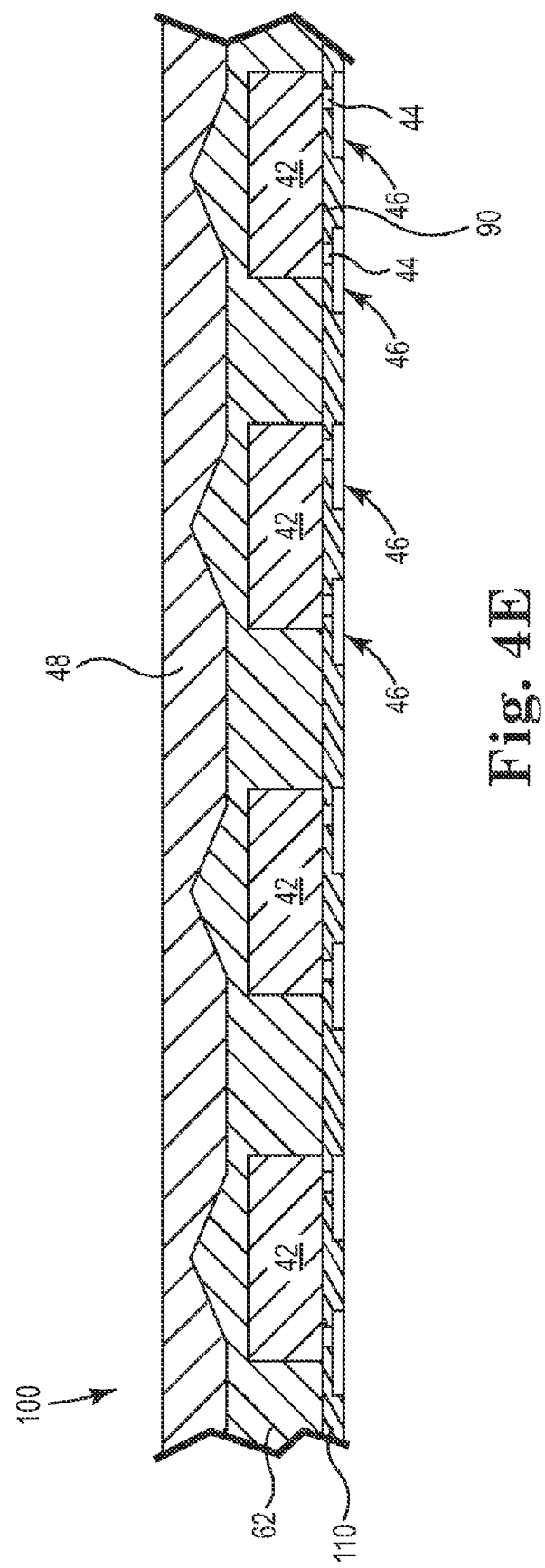

FIG. 4E is a schematic cross-sectional view of work piece 100 including an electrically conducting layer 46 patterned into a dielectric layer 110. In one embodiment, dielectric layer 110 is deposited over first main face 90 of chips 42 and opened in a suitable removal process (e.g., a photolithographic process) to expose contact elements 44. Electrically conducting layer 46 is deposited in a suitable process to connect with contact elements 44. In one embodiment, electrically conducting layer 46 is grown galvanically, plated, sprayed, or otherwise deposited in contact with contact elements 44.

Figure 4F:
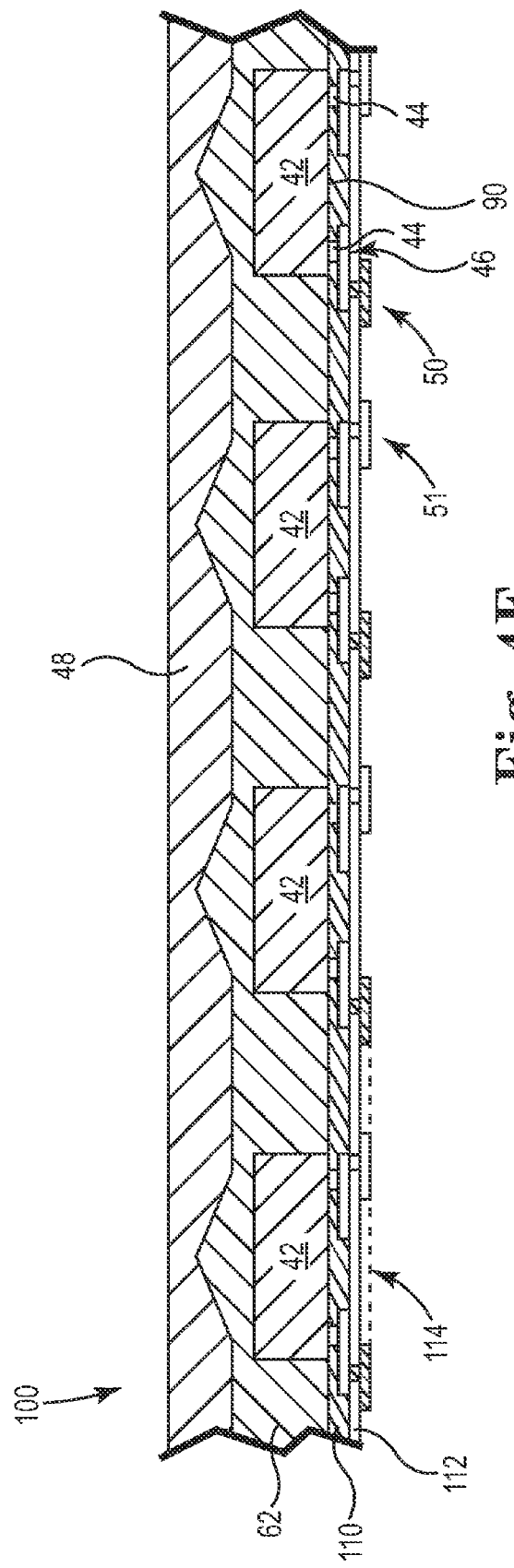

FIG. 4F is a schematic cross-sectional view of work piece 100 including another dielectric layer 112 patterned to include external contact elements 50 in contact with electrically conducting layer 46 and contact elements 44 of chips 42. In one embodiment, dielectric layer 112 is photolithographically opened to communicate with electrically conducting layer 46, and external contact elements 50 are plated or deposited in contact with conducting layer 46. In one embodiment, a sacrificial layer 114 was first patterned to include external contact elements 50 and subsequently removed to expose external contact elements 50 and pads 51 relative to dielectric layer 112. It is to be understood that solder balls or other contacts could be attached to external contact elements 50 and pads 51 to facilitate attaching the fabricated packages to circuit boards and the like.

Figure 4G:
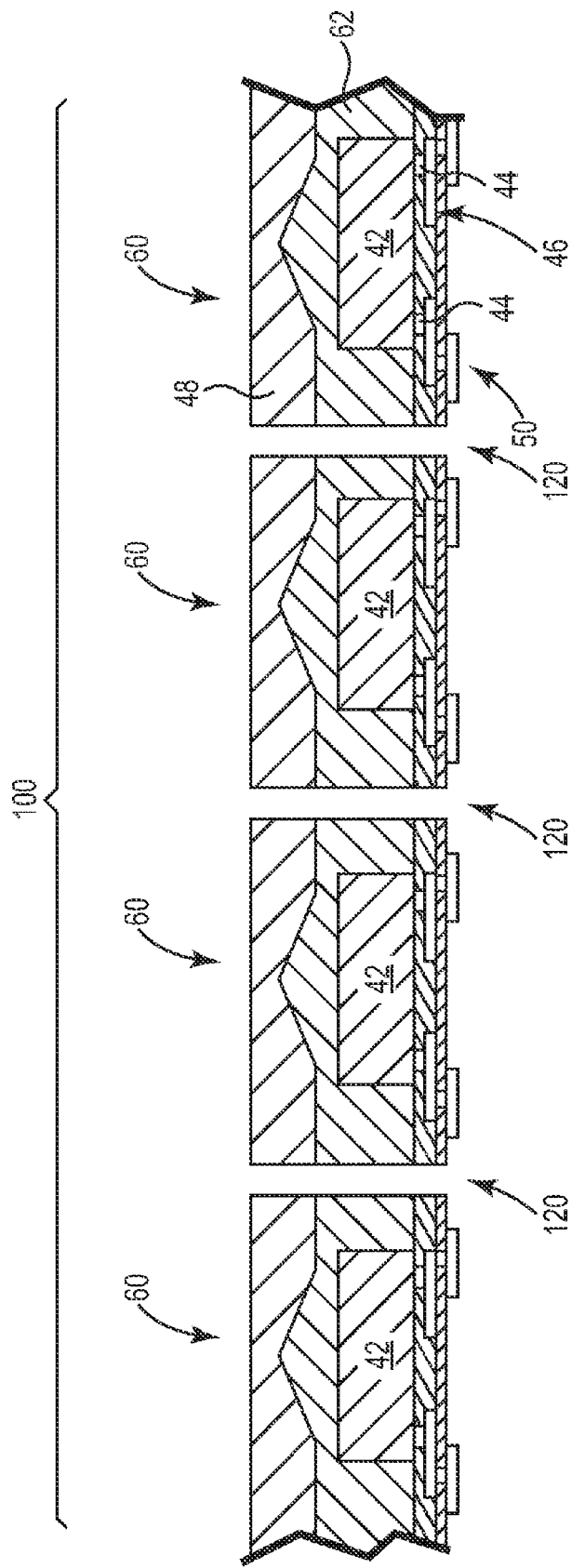

FIG. 4G is a schematic cross-sectional view of work piece 100 singulated along saw streets 120 to provide multiple individual semiconductor devices 40 according to one embodiment. Each of the semiconductor devices 40 has been fabricated to include an electrically conducting layer 46 that is wafer-level patterned in contact with chips 42. The wafer-level processing employed to fabricate electrically conducting layer 46 is compatible with the other semiconductor devices described above including device 20 (FIG. 1), device 40 (FIG. 2), and device 70 (FIG. 3C). Suitable such fabrication processes are described below.

Figure 5:
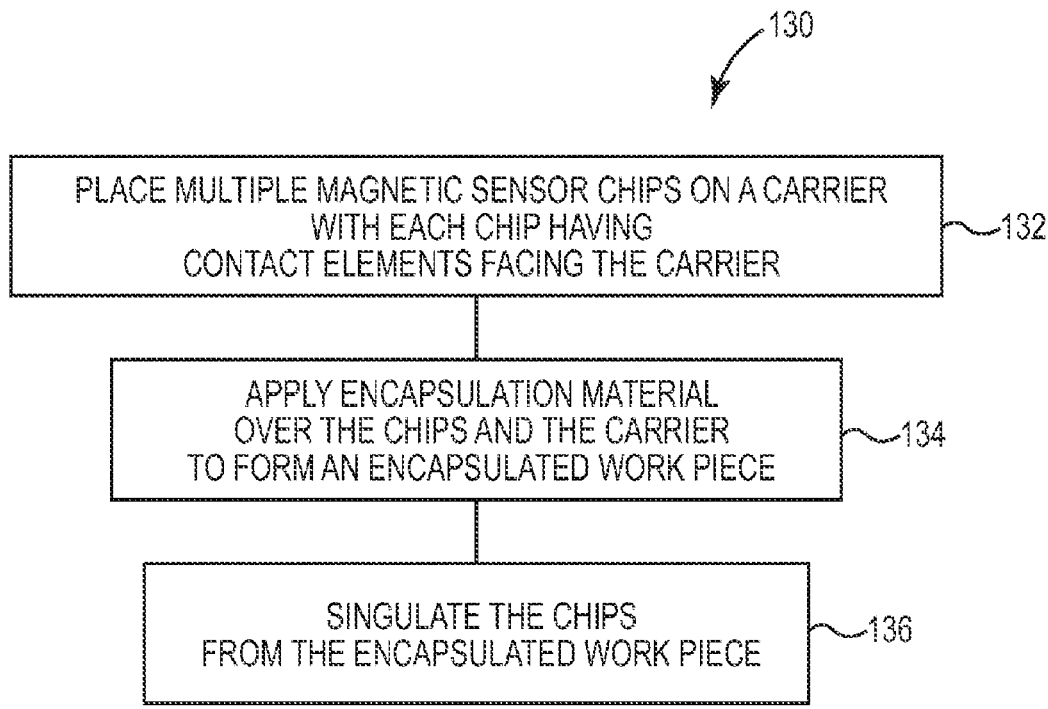
FIG. 5 is a flow diagram of a method of manufacturing a semiconductor device according to one embodiment.

FIG. 5 is a flowchart 130 of a method of manufacturing a semiconductor device according to one embodiment. Flowchart 130 includes at 132 placing multiple magnetic sensor chips on a carrier with each chip having contact elements facing the carrier. Embodiments of fabrication element 132 are illustrated in FIG. 4A.

Flowchart 130 includes at 134 applying encapsulation material over the chips and the carrier to form an encapsulated work piece. Embodiments of fabrication element 134 are illustrated in FIG. 4D.

Flowchart 130 includes at 136 singulating chips from the encapsulated work piece. Embodiments of fabrication element 136 are illustrated in FIG. 4G.

Figure 6:
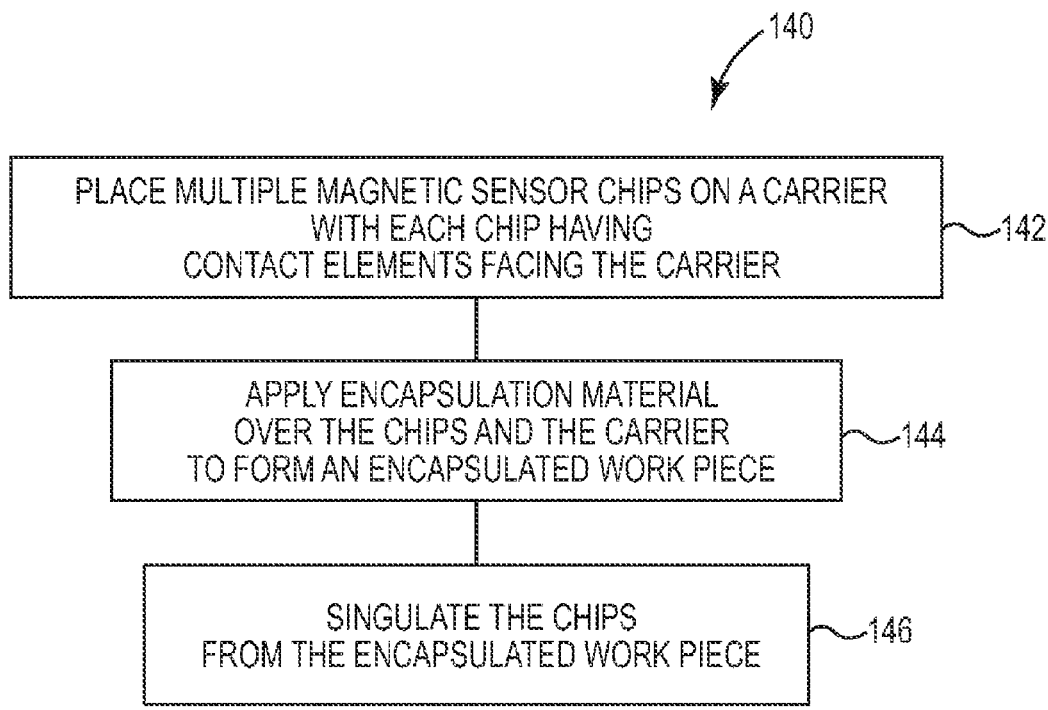
FIG. 6 is a flow diagram of a method of manufacturing a semiconductor device according to one embodiment.

FIG. 6 is a flowchart 140 of a method of manufacturing a semiconductor device according to one embodiment. Flowchart 140 includes at 142 placing multiple magnetic sensor chips on a carrier with each chip having contact elements facing the carrier. At 144, flowchart 140 includes applying magnetic encapsulation material over the chips and the carrier to form an encapsulated work piece. At 146, the encapsulated work piece is singulated to separate chips into individual packages.

Figure 7:
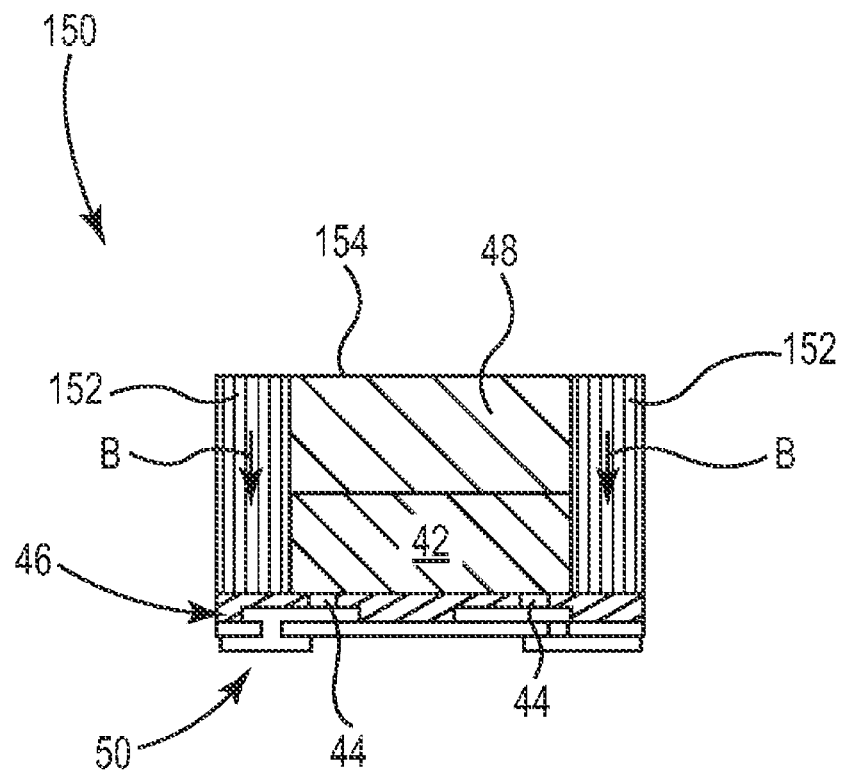
FIG. 7 is a schematic cross-sectional view of a semiconductor device including a region of magnetized magnetic encapsulation material according to one embodiment.

FIG. 7 is a schematic cross-sectional view of a semiconductor device 150 according to one embodiment. Semiconductor device 150 is similar to semiconductor device 40 and includes chip 42, electrically conducting layer 46 wafer-level patterned in contact with chip 42, and magnetic encapsulation material 48 disposed over chip 42. In one embodiment, a first portion 152 of magnetic encapsulation material 48 is selectively magnetized (as represented by arrow B) and positioned on a periphery of a non-magnetized area 154. The selectively magnetized area 152 and the non-magnetized area 154 combine to align magnetic flux lines perpendicular relative to an active surface of chip 42. In one embodiment, magnetized area 152 is achieved by locally heating magnetic encapsulation material 48 during a magnetization process, for example in a laser-assisted manner or with another focused heat source.

Figure 8:
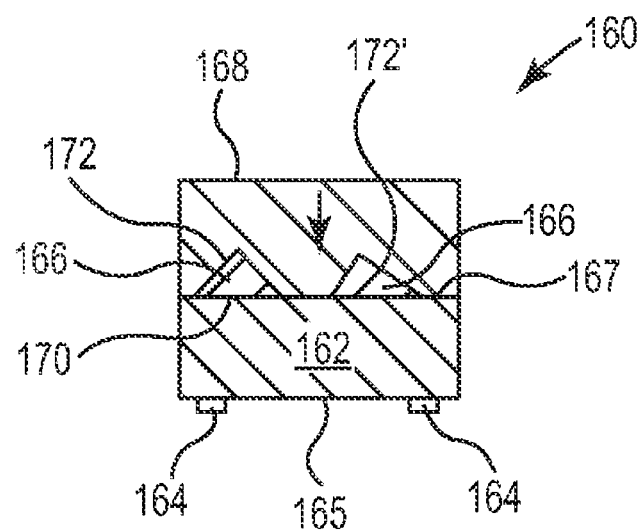
FIG. 8 is a schematic cross-sectional view of a semiconductor device including a non-magnetic layer disposed between a magnetic sensor chip and magnetic encapsulation material according to one embodiment.

FIG. 8 is a schematic cross-sectional view of a semiconductor device 160 according to one embodiment. Semiconductor device 160 includes a chip 162 having contact elements 164 on a first face 165, a non-magnetic layer 166 disposed on chip 162, and a magnetic encapsulation material 168 deposited over non-magnetic layer 166.

In one embodiment, chip 162 includes a second face 167 opposite first face 165, and non-magnetic layer 166 includes a first surface 170 in contact with second face 167 of chip 162 and a second surface 172 opposite first 170. In one embodiment, second surface 172 is structured to include a non-linear structure that is configured to shape magnetic field lines relative to chip 162. In one embodiment, a pair of non-magnetic layers 166 are distributed (e.g., spun or molded) across second face 167 of chip 162 to provide a complex geometry of non-magnetic material configured to selectively shape magnetic field lines relative to two or more sensors integrated into chip 162.

In one embodiment, the structured surface 172 is different from structured surface 172'. In this manner, magnetic field lines directed through chip 162 are suitably diverted in a substantially perpendicular manner relative to an active surface of 162 by the structured geometry of second surface 172 and 172'.

Embodiments described herein provide semiconductor sensor packages having a bias magnet integrally formed in the package on the wafer level. Singulation or separation of the packages from the wafer results in each semiconductor package being provided with a bias magnet. In one embodiment, the bias magnet is provided by a separate permanent magnet attached to the semiconductor chip. In one embodiment, the bias magnet is provided by a layer of magnetic encapsulation material deposited over the semiconductor chip.

Embodiments the semiconductor device as described above are compatible with a solder ball attached to external contacts, where the solder ball is configured for attachment to a printed circuit board to electrically connect the package with the printed circuit board.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of a sensor package having a bias magnet integrated into the package on the wafer-level as discussed herein. Therefore, it is intended that this invention be limited only by the claims and the equivalents thereof.

What is claimed is:

1. A semiconductor device comprising:
a magnetic sensor chip;
an electrically conducting layer wafer-level patterned in contact with the magnetic sensor chip;
encapsulation material disposed on the magnetic sensor chip;
an array of external contact elements electrically coupled with the magnetic sensor chip through the electrically conducting layer;
wherein the magnetic sensor chip comprises a semiconductor chip and the encapsulation material comprises a magnetic encapsulation material deposited over the semiconductor chip opposite the electrically conducting layer; and
a non-magnetic layer between the semiconductor chip and the magnetic encapsulation material.

2. The semiconductor device of claim 1, wherein the non-magnetic layer comprises at least one major surface structured and so configured to shape magnetic field lines passing through the semiconductor chip.

3. A semiconductor device comprising:
a chip comprising contact elements on a first main face of the chip;
an electrically conducting layer wafer-level patterned in contact with the contact elements of the chip;
magnetic encapsulation material disposed on the chip; and an array of external contact elements coupled to the electrically conducting layer and electrically communicating with the contact elements of the chip,
wherein the array of external contact elements is patterned into a dielectric layer disposed over the electrically conducting layer.

4. The semiconductor device of claim 3, further comprising:
a solder ball connected to a pad of at least one of the array of external contact elements.

5. A semiconductor device comprising:
a chip comprising contact elements on a first main face of the chip;
an electrically conducting layer wafer-level patterned in contact with the contact elements of the chip;
magnetic encapsulation material disposed on the chip; and
an array of external contact elements coupled to the electrically conducting layer and electrically communicating with the contact elements of the chip,
wherein the magnetic encapsulation material comprises a polymer matrix comprising permanent magnetic particles distributed within the polymer matrix.

6. The semiconductor device of claim 5, wherein a first portion of the magnetic encapsulation material is selectively demagnetized and a second portion of the magnetic encapsulation material is selectively magnetized.

7. A semiconductor device comprising:
a chip comprising contact elements on a first main face of the chip;
an electrically conducting layer wafer-level patterned in contact with the contact elements of the chip;
magnetic encapsulation material disposed on the chip;
an array of external contact elements coupled to the electrically conducting layer and electrically communicating with the contact elements of the chip;
a non-magnetic layer between the chip and the magnetic encapsulation material.

8. The semiconductor device of claim 7, wherein the non-magnetic layer comprises at least one surface structured and configured to shape magnetic field lines passing through the chip.

9. The semiconductor device of claim 3, wherein the chip comprises one of a Hall sensor, a magneto-resistive element, and a giant magnetic resistor.

10. A semiconductor device comprising:
a chip comprising contact elements on a first face; and
magnetic encapsulation material wafer-level deposited over a second face of the chip opposite the first face, wherein singulation of the semiconductor device from a wafer provides a chip-sized package with the magnetic encapsulation material embedding sides of the chip.

11. The semiconductor device of claim 10, further comprising:
a non-magnetic layer disposed on at least a portion of the second face of the chip, the non-magnetic layer comprising a first surface in contact with the second face of the chip and a second surface opposite the first surface, the second surface of the non-magnetic layer comprising a non-linear surface configured to shape a magnetic field lines relative to a sensor surface of the chip.

12. The semiconductor device of claim 10, further comprising:
a through-silicon via formed between the first and second faces of the chip and an electrical pathway established in the through-silicon via extending between each contact element and the second face of the chip.

13. A method of manufacturing the semiconductor device of claim 1, the method comprising:
placing multiple magnetic sensor chips on a carrier, each of the multiple magnetic sensor chips comprising contact elements facing the carrier;
applying encapsulation material over the multiple magnetic sensor chips and the carrier and forming an encapsulated work piece; and
singulating the multiple magnetic sensor chips from the encapsulated work piece.

14. The method of claim 13, further comprising:
separating the encapsulated work piece from the carrier.

15. The method of claim 14, further comprising:
structuring a major surface of the non-magnetic layer opposite the multiple chips, the structuring configured to shape magnetic field lines that pass through each chip; and
applying magnetic encapsulation material over the non-magnetic layer.

16. The method of claim 15, further comprising:
depositing a dielectric layer over the electrically conducting layer, selectively opening the dielectric layer, and patterning an array of external contacts in contact with the electrically conducting layer.

17. The method of claim 13, wherein each of the multiple magnetic sensor chips comprises a semiconductor chip and the encapsulation material comprises magnetic encapsulation material.

18. The method of claim 13, wherein singulating the multiple magnetic sensor chips from the encapsulated work piece comprises one of sawing, cutting, laser irradiating, and etching individual magnetic sensor chips from the encapsulated work piece.

19. A method of manufacturing the semiconductor device of claim 3, the method comprising:
placing multiple chips on a carrier, each of the multiple chips comprising contact elements facing the carrier;
applying magnetic encapsulation material over the multiple chips and the carrier and forming an encapsulated work piece; and
singulating the multiple chips from the encapsulated work piece.

20. The method of claim 19, further comprising:
depositing a non-magnetic layer over the multiple chips opposite the contact elements;
structuring a major surface of the non-magnetic layer opposite the multiple chips, the structuring configured to shape magnetic field lines that pass through each chip; and
applying magnetic encapsulation material over the non-magnetic layer.

21. The method of claim 19, wherein applying magnetic encapsulation material comprises applying a polymer matrix containing a distribution of permanent magnetic particles.

22. The method of claim 19, further comprising:
separating the encapsulated work piece from the carrier;
patterning an electrically conducting layer onto the contact elements of the multiple chips; and
depositing a dielectric layer over the electrically conducting layer, selectively opening the dielectric layer, and patterning an array of external contacts in contact with the electrically conducting layer.

* * * * *